(12) United States Patent
Detani et al.

(10) Patent No.: US 9,844,816 B2
(45) Date of Patent: Dec. 19, 2017

(54) SURFACE-COATED CUTTING TOOL

(71) Applicant: SUMITOMO ELECTRIC HARDMETAL CORP., Itami-shi (JP)

(72) Inventors: Takanori Detani, Sorachi-gun (JP); Shinya Imamura, Sorachi-gun (JP); Hideaki Kanaoka, Sorachi-gun (JP); Anongsack Paseuth, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/102,584

(22) PCT Filed: Oct. 9, 2015

(86) PCT No.: PCT/JP2015/078836
§ 371 (c)(1),
(2) Date: Jun. 8, 2016

(87) PCT Pub. No.: WO2017/061058
PCT Pub. Date: Apr. 13, 2017

(65) Prior Publication Data
US 2017/0259344 A1    Sep. 14, 2017

(51) Int. Cl.
*B23B 27/14* (2006.01)
*C23C 16/40* (2006.01)
*C23C 16/56* (2006.01)

(52) U.S. Cl.
CPC .......... *B23B 27/148* (2013.01); *C23C 16/403* (2013.01); *C23C 16/56* (2013.01); *B23B 2224/04* (2013.01); *B23B 2224/32* (2013.01); *B23B 2228/04* (2013.01); *B23B 2228/105* (2013.01)

(58) Field of Classification Search
USPC .................... 51/307, 309; 428/212, 701, 702
See application file for complete search history.

(56) References Cited

U.S. PATENT DOCUMENTS

| | | | |
|---|---|---|---|
| 6,713,172 B2 * | 3/2004 | Ljungberg | ............ C23C 16/403 428/701 |
| RE41,111 E * | 2/2010 | Oshika | ................ C23C 16/0272 51/307 |
| 2014/0287210 A1 | 9/2014 | Tomita et al. | |

FOREIGN PATENT DOCUMENTS

| JP | 10-204639 A | 8/1998 |
|---|---|---|
| JP | 2000-218410 A | 8/2000 |
| JP | 2013-063504 A | 4/2013 |
| WO | WO-2015/113866 A1 | 8/2015 |
| WO | WO-2015/114049 A1 | 8/2015 |

OTHER PUBLICATIONS

International Search Report in PCT International Application No. PCT/JP2015/078836, dated Nov. 10, 2015.

* cited by examiner

*Primary Examiner* — Archene Turner
(74) *Attorney, Agent, or Firm* — Venable LLP; Michael A. Sartori; Miguel A. Lopez

(57) ABSTRACT

A surface-coated cutting tool includes a base material and a coating formed on the base material. The coating includes an $\alpha$-$Al_2O_3$ layer containing a plurality of $\alpha$-$Al_2O_3$ crystal grains. The $\alpha$-$Al_2O_3$ layer includes a lower layer portion disposed at a side of the base material, an intermediate portion disposed on the lower layer portion, and an upper layer portion disposed on the intermediate portion. In a crystal orientation mapping performed on a polished cross-sectional surface of the $\alpha$-$Al_2O_3$ layer using an EBSD, an area ratio of $\alpha$-$Al_2O_3$ crystal grains with (001) orientation in the lower layer portion is less than 35%, an area ratio of $\alpha$-$Al_2O_3$ crystal grains with (001) orientation in the intermediate portion is 35% or more, and an area ratio of $\alpha$-$Al_2O_3$ crystal grains with (001) orientation in the upper layer portion is less than 35%.

3 Claims, No Drawings

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. For example, Japanese Patent Laying-Open No. 2013-063504 (PTD 1) proposes a surface-coated cutting tool having a coating including a lower layer and an upper layer. The lower layer is a Ti compound layer. The upper layer is disposed on the lower layer and formed of an $Al_2O_3$ layer having an α-type crystal structure. In particular, PTD 1 discloses that this surface-coated cutting tool has a feature that (11-20) orientation is 30 to 70 area % in the interface between the upper layer and the lower layer, and a feature that (0001) orientation is 45 area % or more in the entire upper layer. Meanwhile, PTD 1 does not disclose distribution of (001) orientation in the thickness direction of the α-$Al_2O_3$ layer.

Japanese Patent Laying-Open No. 10-204639 (PTD 2) proposes a surface-coated cemented-carbide cutting tool having a hard coating layer formed of an α-type aluminum oxide composite layer. The α-type aluminum oxide composite layer is made up of two or more α-type aluminum oxide unit layers exhibiting different x-ray diffraction patterns. In the x-ray diffraction patterns of the α-type aluminum oxide unit layers, a highest peak appears at any of 25.5°, 35.5°, 37.2°, and 68.4° of 2θ. A ratio ($H_1/H_2$) of the highest peak height ($H_1$) to a second-highest peak height ($H_2$) in the same x-ray diffraction pattern is 1.5 to 2.7.

Japanese Patent Laying-Open No. 2000-218410 (PTD 3) proposes a surface-coated cemented-carbide cutting tool having a hard coating layer including an aluminum oxide layer having an α-type crystal structure. The aluminum oxide layer is made up of a lower layer with strong crystal orientation and an upper layer with weak crystal orientation. The ratio of the thickness of the upper layer to the total thickness of the upper layer and the lower layer is 10 to 40%.

CITATION LIST

Patent Document

PTD 1: Japanese Patent Laying-Open No. 2013-063504
PTD 2: Japanese Patent Laying-Open No. 10-204639
PTD 3: Japanese Patent Laying-Open No. 2000-218410

SUMMARY OF INVENTION

Technical Problem

As proposed in above-referenced PTD 1 to PTD 3, it is expected that improvement of the α-$Al_2O_3$ coating quality will accordingly improve the performance of the cutting tool made of cemented carbide, particularly improve the crater wear resistance and the chipping resistance. However, in the case where the coating quality is improved based on the orientation of $Al_2O_3$ crystal grains in a certain direction as disclosed in PTD 1, various problems are involved while the effect of improving the coating strength is obtained.

For example, α-$Al_2O_3$ crystal grains with (001) orientation exhibit a tendency that the thermal expansion coefficient increases in the direction parallel with the surface of the base material. Therefore, during cooling after the coating is formed, there is a possibility that many cracks are generated in the coating. Moreover, because the α-$Al_2O_3$ crystal grains with (001) orientation grow at a high rate, there is also a possibility that the crystal grains are coarsened and the wear resistance is deteriorated. In contrast, in the case where the coating quality is improved based on the coating containing a plurality of $Al_2O_3$ crystal grains having different orientations as disclosed in above-referenced PTD 2 and PTD 3, the ratio of α-$Al_2O_3$ crystal grains oriented in a certain direction (the direction of (001) plane for example) is low, and therefore it is difficult to sufficiently obtain the effect of improving the coating strength.

The present invention has been made in view of the above-described circumstances, and an object of the present invention is to provide a surface-coated cutting tool in which the effect of improving the coating strength is sufficiently achieved, and further, coarsening of crystal grains can be prevented and generation of cracks in the coating during cooling can be prevented.

Solution to Problem

A surface-coated cutting tool according to an aspect of the present invention includes a base material and a coating formed on the base material. The coating includes an α-$Al_2O_3$ layer containing a plurality of α-$Al_2O_3$ crystal grains. The α-$Al_2O_3$ layer includes a lower layer portion disposed at a side of the base material, an intermediate portion disposed on the lower layer portion, and an upper layer portion disposed on the intermediate portion. In a crystal orientation mapping performed on a polished cross-sectional surface of the α-$Al_2O_3$ layer using an electron backscatter diffraction analysis apparatus, an area ratio of α-$Al_2O_3$ crystal grains with (001) orientation in the lower layer portion is less than 35%, an area ratio of α-$Al_2O_3$ crystal grains with (001) orientation in the intermediate portion is 35% or more, and an area ratio of α-$Al_2O_3$ crystal grains with (001) orientation in the upper layer portion is less than 35%. The α-$Al_2O_3$ layer has a thickness of 4 to 18 μm, a thickness of the intermediate portion occupies 50% or more of the thickness of the α-$Al_2O_3$ layer, and the lower layer portion and the upper layer portion each have a thickness of 1 μm or more.

Advantageous Effects of Invention

According to the foregoing, the effect of improving the coating strength is sufficiently achieved, and further, coarsening of crystal grains can be prevented and generation of cracks in the coating during cooling can be prevented.

DESCRIPTION OF EMBODIMENTS

Description of Embodiment of the Invention

First of all, the present invention will be described based on features listed below.

[1] A surface-coated cutting tool according to an aspect of the present invention includes a base material and a coating formed on the base material. The coating includes an α-$Al_2O_3$ layer containing a plurality of α-$Al_2O_3$ crystal grains. The α-$Al_2O_3$ layer includes a lower layer portion disposed at a side of the base material, an intermediate portion disposed on the lower layer portion, and an upper layer portion disposed on the intermediate portion. An area ratio of α-$Al_2O_3$ crystal grains with (001) orientation in the lower layer portion is less than 35% in a crystal orientation mapping, the crystal orientation mapping being performed on a polished cross-sectional surface of the $\alpha\text{-Al}_2\text{O}_3$ layer using an electron backscatter diffraction analysis apparatus. An area ratio of $\alpha\text{-Al}_2\text{O}_3$ crystal grains with (001) orientation in the intermediate portion is 35% or more in the crystal orientation mapping. An area ratio of $\alpha\text{-Al}_2\text{O}_3$ crystal grains with (001) orientation in the upper layer portion is less than 35% in the crystal orientation mapping. The $\alpha\text{-Al}_2\text{O}_3$ layer has a thickness of 4 to 18 μm, a thickness of the intermediate portion occupies 50% or more of the thickness of the $\alpha\text{-Al}_2\text{O}_3$ layer, and the lower layer portion and the upper layer portion each have a thickness of 1 μm or more. In the cutting tool having the above-specified features, the effect of improving the coating strength is sufficiently achieved, and further, coarsening of crystal grains can be prevented and occurrence of cracks in the coating during cooling can be prevented.

[2] Preferably, an area ratio of $\alpha\text{-Al}_2\text{O}_3$ crystal grains with (110) orientation in the lower layer portion is 40% or more in the crystal orientation mapping. Accordingly, the effect of suppressing coarsening of crystal grains can be enhanced.

[3] Preferably, an area ratio of $\alpha\text{-Al}_2\text{O}_3$ crystal grains with (110) orientation in the upper layer portion is 40% or more in the crystal orientation mapping. Accordingly, the effect of suppressing occurrence of cracks in the coating during cooling can be enhanced.

Details of Embodiment of the Invention

In the following, an embodiment of the present invention (hereinafter also referred to as "present embodiment") will be described in further detail.

<Surface-Coated Cutting Tool>

A surface-coated cutting tool of the present embodiment includes a base material and a coating formed on the base material. The coating preferably covers the entire surface of the base material. However, even the cutting tool in which a part of the base material is not covered with this coating or the structure and makeup of the coating is partially different does not go beyond the scope of the present invention.

The surface-coated cutting tool of the present embodiment can suitably be used as a cutting tool such as drill, end mill, indexable insert for the drill, indexable insert for the end mill, indexable insert for milling, indexable insert for turning, metal-slitting saw, gear-cutting tool, reamer, tap, or the like.

<Base Material>

As the base material, any base material conventionally known as a base material of this type may be used. For example, the base material is preferably any of a cemented carbide (including, for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, silicon nitride, aluminum nitride, aluminum oxide, or the like), cubic boron nitride sintered body, and a diamond sintered body.

Among these variety of base materials, the cemented carbide, particularly WC-based cemented carbide, or the cermet (particularly TiCN-based cermet) is preferably selected. These base materials are particularly excellent in balance between hardness and strength at high temperature, and have excellent characteristics for the base material of the surface-coated cutting tool for the above-described use.

In the case where the surface-coated cutting tool is an indexable insert or the like, the base material may have or may not have a chip breaker. Moreover, the shape of the edge ridgeline may be any of a sharp edge (the ridge where the rake face and the flank face meet each other), a honed edge (a sharp edge processed to be rounded), a negative land (beveled), and a combination of the honed edge and the negative land.

<Coating>

The coating includes an $\alpha\text{-Al}_2\text{O}_3$ layer containing a plurality of $\alpha\text{-Al}_2\text{O}_3$ (aluminum oxide having an α-type crystal structure) crystal grains. For example, the coating may be made up of a plurality of layers including at least one $\alpha\text{-Al}_2\text{O}_3$ layer containing a plurality of $\alpha\text{-Al}_2\text{O}_3$ crystal grains and further including other layers. The $\alpha\text{-Al}_2\text{O}_3$ layer contains polycrystalline $\alpha\text{-Al}_2\text{O}_3$ containing a plurality of $\alpha\text{-Al}_2\text{O}_3$ crystal grains. The $\alpha\text{-Al}_2\text{O}_3$ crystal grains usually have a grain size on the order of 0.1 to 2 μm.

The coating has a thickness of 4 to 45 μm (4 μm or more and 45 μm or less, it should be noted that a numerical value range expressed with "-" or "to" herein includes numerical values of the upper limit and the lower limit). Preferably, the coating has a thickness of 5 to 35 μm. If this thickness is less than 4 μm, there is a possibility that the wear resistance is insufficient. If this thickness is more than 45 μm, there is a possibility that the coating is peeled off or broken highly frequently when a large stress is applied between the coating and the base material during intermittent processing or the like. It should be noted that "thickness" herein of the coating, and various films and layers such as $\alpha\text{-Al}_2\text{O}_3$ layer, TiCN layer, and the like described later herein means "average thickness."

Examples of the aforementioned other layers may be TiCNO layer, TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, and the like. A compound expressed herein by a chemical formula like the above-referenced ones includes the compound with any of all conventionally known atomic ratios if the atomic ratio is not particularly limited, and the compound is not necessarily limited to the compound with a stoichiometric ratio.

For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." Moreover, in the present embodiment, the metal element such as Ti, Al, Si, Zr, or Cr and the non-metal element such as N (nitrogen), O (oxygen), or C (carbon) may not necessarily constitute a stoichiometric composition.

An example of the other layers is a TiCN layer for example. The TiCN layer is disposed between the $\alpha\text{-Al}_2\text{O}_3$ layer and the base material. This TiCN layer is excellent in wear resistance and therefore can provide higher wear resistance to the coating. The TiCN layer is particularly preferably formed by the MT-CVD (medium temperature CVD) method. The MT-CVD method can be used to form a layer at a relatively low temperature of approximately 850 to 900° C., and can reduce damage to the base material caused by heating in the process of forming the layer.

The thickness of the TiCN layer is preferably 2 to 20 μm. If this thickness is less than 2 μm, there is a possibility that wear is likely to increase. If this thickness is more than 20 µm, there is a possibility that the chipping resistance is deteriorated.

As the other layers, an outermost surface layer and an intermediate layer and the like may be included in the coating. The outermost surface layer is a layer located at the outermost surface position the coating. The intermediate layer is a layer disposed between the outermost surface layer and the $\alpha$-$Al_2O_3$ layer, between the $\alpha$-$Al_2O_3$ layer and the TiCN layer, or between the TiCN layer and the base material, for example. An example of the outermost surface layer may for example be a TiN layer. An example of the intermediate layer may for example be a TiCNO layer.

<$\alpha$-$Al_2O_3$ Layer>

The $\alpha$-$Al_2O_3$ layer includes a lower layer portion disposed at a side of the base material, an intermediate portion disposed on the lower layer portion, and an upper layer portion disposed on the intermediate portion.

An area ratio of $\alpha$-$Al_2O_3$ crystal grains with (001) orientation in the lower layer portion is less than 35% in a crystal orientation mapping. The crystal orientation mapping is performed on a polished cross-sectional surface of the $\alpha$-$Al_2O_3$ layer by means of an electron backscatter diffraction (EBSD) analysis apparatus.

An area ratio of $\alpha$-$Al_2O_3$ crystal grains with (001) orientation in the intermediate portion is 35% or more in this crystal orientation mapping. An area ratio of $\alpha$-$Al_2O_3$ crystal grains with (001) orientation in the upper layer portion is less than 35% in this crystal orientation mapping.

In the surface-coated cutting tool of the present embodiment, the intermediate portion has an area ratio of 35% or more of the $\alpha$-$Al_2O_3$ crystal grains with (001) orientation. The $\alpha$-$Al_2O_3$ layer has orientation in the specific direction (direction of (001) plane), and accordingly, the effect of improving the coating strength can sufficiently be achieved. Moreover, since the lower layer portion has an area ratio of less than 35% of the $\alpha$-$Al_2O_3$ crystal grains with (001) orientation, coarsening of the $\alpha$-$Al_2O_3$ crystal grains can be prevented and deterioration of the wear resistance can be suppressed. Further, since the upper layer portion has an area ratio of less than 35% of the $\alpha$-$Al_2O_3$ crystal grains with (001) orientation, generation of cracks in the coating during cooling can be prevented and deterioration of the chipping resistance can be suppressed. That is, since such a lower layer portion and an upper layer portion are included, disadvantages caused by excessively strong orientation in the (001) plane direction of the $\alpha$-$Al_2O_3$ layer can be suppressed, namely coarsening of the $\alpha$-$Al_2O_3$ crystal grains and generation of cracks in the coating during cooling can be suppressed.

"$\alpha$-$Al_2O_3$ crystal grains with (001) orientation" herein refer to $\alpha$-$Al_2O_3$ crystal grains with an inclination angle of the (001) plane of 0 to 10° with respect to the normal line to the surface of the base material (the surface located at the surface of the coating) (namely the inclination angle is an angle formed by the normal line to the surface of the base material and the normal line to the (001) plane). In the $\alpha$-$Al_2O_3$ layer, whether or not any $\alpha$-$Al_2O_3$ crystal grains have the (001) orientation can be confirmed by means of a field emission scanning electron microscope (FE-SEM) having an EBSD apparatus. EBSD is based on automatic analysis of a Kikuchi diffraction pattern generated by backscattering electrons.

For example, an FE-SEM having an EBSD apparatus is used, and an image is taken of a polished cross-sectional surface which is a cross-sectional surface of the $\alpha$-$Al_2O_3$ layer (vertical cross section of the $\alpha$-$Al_2O_3$ layer) along a plane including the normal line to the surface of the base material (the fact that the polished cross-sectional surface is a cross-sectional surface having been polished will be described later herein). Next, calculation is done of the angle formed by the normal line to the (001) plane of each pixel of the taken image and the normal line to the surface of the base material (namely the direction of the line parallel with the thickness direction of the $\alpha$-$Al_2O_3$ layer in the polished cross-sectional surface). Then, a pixel with this angle within 0 to 10° is selected. The selected pixel corresponds to $\alpha$-$Al_2O_3$ crystal grains with an inclination angle of the (001) plane of 0 to 10° with respect to the surface of the base material, namely $\alpha$-$Al_2O_3$ crystal grains with (001) orientation.

The area ratio of $\alpha$-$Al_2O_3$ crystal grains with (001) orientation in a predetermined region of the polished cross-sectional surface of the $\alpha$-$Al_2O_3$ layer is calculated based on a color map by crystal orientation mapping. The color map is produced by distinguishing the selected pixel with a certain color for the $\alpha$-$Al_2O_3$ layer of the polished cross-sectional surface. The crystal orientation mapping assigns a predetermined color to the selected pixel, and therefore, the area ratio of $\alpha$-$Al_2O_3$ crystal grains with (001) orientation in a predetermine region can be calculated, based on the assigned color as an indicator. Calculation of the aforementioned angle, selection of a pixel with this angle of 0 to 10°, and the calculation of the area ratio may be conducted by means of commercially available software (trademark: "Orientation Imaging Microscopy Ver 6.2" manufactured by EDAX).

By the aforementioned crystal orientation mapping, the $\alpha$-$Al_2O_3$ layer in the present embodiment is identified as including the lower layer portion which is disposed at a side of the base material and in which the area ratio of the $\alpha$-$Al_2O_3$ crystal grains with (001) orientation is less than 35%. Moreover, the $\alpha$-$Al_2O_3$ layer is identified as including the intermediate portion which is disposed on the lower layer portion and in which the area ratio of the $\alpha$-$Al_2O_3$ crystal grains with (001) orientation is 35% or more. Moreover, the $\alpha$-$Al_2O_3$ layer is identified as including the upper layer portion which is disposed on the intermediate portion and in which the area ratio of the $\alpha$-$Al_2O_3$ crystal grains with (001) orientation is less than 35%. It should be noted, for calculation of the area ratio of $\alpha$-$Al_2O_3$ crystal grains with (001) orientation, an observation magnification of the FE-SEM can be selected appropriately from a range of 2000× to 20000×. The field-of-view number (approximately 1 to 10) can be adjusted so that the observation area is 200 to 10000 µm², which is for example 250 µm².

In the crystal orientation mapping, the lower layer portion preferably has an area ratio of 30% or less of $\alpha$-$Al_2O_3$ crystal grains with (001) orientation. This is for the reason that coarsening of the $\alpha$-$Al_2O_3$ crystal grains can effectively be prevented. In the crystal orientation mapping, the intermediate portion preferably has an area ratio of 40% or more of $\alpha$-$Al_2O_3$ crystal grains with (001) orientation. This is for the reason that the orientation in the (001) plane direction makes it possible to sufficiently advantageously obtain the effect of improving the coating strength. In the crystal orientation mapping, the upper layer portion preferably has an area ratio of 30% or less of $\alpha$-$Al_2O_3$ crystal grains with (001) orientation. This is for the reason that generation of cracks in the coating can effectively be prevented during cooling and in use.

In the crystal orientation mapping, preferably the lower layer portion has a lower limit of 0% of the area ratio of $\alpha$-$Al_2O_3$ grains with (001) orientation. Preferably the intermediate portion has an upper limit of 100% of the area ratio of α-Al$_2$O$_3$ grains with (001) orientation. Preferably the upper layer portion has a lower limit of 0% of the area ratio of α-Al$_2$O$_3$ grains with (001) orientation. Each layer portion having such a range of the area ratio can produce the above-described effects.

<Thickness of α-Al$_2$O$_3$ Layer>

The α-Al$_2$O$_3$ layer has a thickness of 4 to 18 μm. Such a thickness enables improvements of the wear resistance and the chipping resistance. The effect of suppressing adhesion of a workpiece can also be obtained. In particular, the thickness of the α-Al$_2$O$_3$ layer is preferably 5 to 15 μm. If the thickness of the α-Al$_2$O$_3$ layer is less than 4 μm, the thickness is excessively small and there is a possibility that the effect of improving the wear resistance and the effect of suppressing adhesion of the workpiece are not obtained. If the thickness of the α-Al$_2$O$_3$ layer is more than 18 μm, the thickness is excessively large and there is a possibility that the coating is likely to peel off and the chipping resistance is deteriorated.

<Ratio of Thickness of Intermediate Portion to Thickness of α-Al$_2$O$_3$ Layer>

The thickness of the intermediate portion occupies 50% or more of the thickness of the α-Al$_2$O$_3$ layer. Accordingly, the area ratio of the α-Al$_2$O$_3$ crystal grains with (001) orientation to the entire α-Al$_2$O$_3$ layer is high, and therefore the effect of improving the coating strength can sufficiently be obtained. The upper limit of the ratio of the thickness of the intermediate portion is 80%. If the ratio of the thickness of the intermediate portion is more than the upper limit, namely 80%, the thickness of the upper layer portion or the lower layer portion is too thin, and there is a possibility that the effect of suppressing coarsening of α-Al$_2$O$_3$ crystal grains or the effect of suppressing generation of cracks cannot sufficiently be obtained. The optimum ratio of the thickness of the intermediate portion is 55 to 65% to the thickness of the α-Al$_2$O$_3$ layer.

Here, the thickness of each of the lower layer portion, the intermediate portion, and the upper layer portion can be calculated in the following way. Namely, on the aforementioned polished cross-sectional surface, an image of a range of 1×1 μm is taken with an FE-SEM having an EBSD apparatus, successively in the direction from the front surface of the α-Al$_2$O$_3$ layer (the surface at a side of the front surface of the coating) toward the base material along the direction normal line to the surface of the base material, and the area ratio of α-Al$_2$O$_3$ crystal grains with (001) orientation is calculated. Initially, a region where the area ratio of α-Al$_2$O$_3$ crystal grains with (001) orientation is less than 35% is identified as the upper layer portion. Subsequently, when a region where this area ratio is 35% or more is found, this region is identified as the intermediate portion. After this, when a region where this area ratio is less than 35% is found again, this region is identified as the lower layer portion. After the lower layer portion, the intermediate portion, and the upper layer portion are identified, an image of a range of 1×1 μm is taken again at five locations which are not unevenly distributed in each specified portion on the polished cross-sectional surface. Thus, the thickness of each layer portion can be determined.

Consequently, the thickness of the intermediate portion in the present embodiment occupies 50% or more of the thickness of the α-Al$_2$O$_3$ layer. Further, the lower layer portion and the upper layer portion each have a thickness of 1 μm or more.

The thickness of the α-Al$_2$O$_3$ layer can be measured through observation of the above-described polished cross-sectional surface. For example, the thickness of the α-Al$_2$O$_3$ layer can be measured through observation of the polished cross-sectional surface of the α-Al$_2$O$_3$ layer, by means of a field emission scanning electron microscope (FE-SEM) having an energy dispersive x-ray spectroscopy (EDS) analyzer. Multiple locations on the polished cross-sectional surface of the α-Al$_2$O$_3$ layer may be observed and the average of respective thicknesses at these locations may be determined. In the present embodiment, the α-Al$_2$O$_3$ layer has a thickness of 4 to 18 μm.

<α-Al$_2$O$_3$ Crystal Grains with (110) Orientation in Lower Layer Portion and Upper Layer Portion>

In the crystal orientation mapping, preferably the lower layer portion of the α-Al$_2$O$_3$ layer has an area ratio of 40% or more of α-Al$_2$O$_3$ crystal grains with (110) orientation. The thermal expansion coefficient of α-Al$_2$O$_3$ is high in the direction normal line to the (110) plane and low in the direction parallel with the (110) plane. Therefore, the thermal expansion coefficient of the lower layer portion can be made relatively low to effectively prevent generation of cracks in the coating during cooling and advantageously suppress deterioration of the chipping resistance. Moreover, under a condition of forming a coating for obtaining (001) orientation, the α-Al$_2$O$_3$ crystal grains are likely to be coarsened. Therefore, this is suppressed by disposing an α-Al$_2$O$_3$ layer which does not have the (001) orientation. Accordingly, decrease of the hardness due to coarsening of α-Al$_2$O$_3$ crystal grains can effectively be prevented and deterioration of the wear resistance can advantageously be suppressed.

In the crystal orientation mapping, preferably the upper layer portion of the α-Al$_2$O$_3$ layer has an area ratio of 40% or more of α-Al$_2$O$_3$ crystal grains with (110) orientation. Accordingly, generation of cracks in the coating in use can effectively be prevented and deterioration of the chipping resistance can advantageously be suppressed.

It is considered that, as the angle (orientation difference) between oriented crystal planes is larger, cracks are less likely to extend and the effect of suppressing chipping of the cutting edge can be obtained. Therefore, in the case where crystal grains with an angle of approximately 90° between oriented crystal grains coexist in the layer, it is possible to effectively obtain the effect of suppressing generation and extension of cracks.

The (110) plane of α-Al$_2$O$_3$ crystal grains forms an angle of 90° with the (001) plane. Therefore, in the present embodiment, the upper layer portion and the lower layer portion having the α-Al$_2$O$_3$ crystal grains with (001) orientation are controlled so that these layers have α-Al$_2$O$_3$ crystal grains with (110) orientation, to thereby enable both the effect of suppressing generation of cracks and the effect of suppressing coarsening of crystal grains to be obtained.

In contrast, the intermediate portion of the α-Al$_2$O$_3$ layer has an area ratio of 35% or more of α-Al$_2$O$_3$ crystal grains with (001) orientation. This orientation in the (001) plane direction in the intermediate portion enables the effect of improving the coating strength to be obtained sufficiently in the surface-coated cutting tool of the present embodiment.

The area ratio of 40% or more of α-Al$_2$O$_3$ crystal grains with (110) orientation in each of the lower layer portion and the upper layer portion can also be measured from the crystal orientation mapping for the polished cross-sectional surface of the α-Al$_2$O$_3$ layer by means of an electron backscatter diffraction analysis apparatus. "α-Al$_2$O$_3$ crystal grains with (110) orientation" herein refer to α-Al$_2$O$_3$ crystal grains with an inclination angle of the (110) plane of 0 to 10° to with respect to the normal line to the surface of the base material (namely the inclination angle is an angle formed by the normal line to the surface of the base material and the normal line to the (110) plane).

Specifically, an FE-SEM having an EBSD apparatus is used to take an image of the polished cross-sectional surface of the $\alpha$-$Al_2O_3$ layer, and the aforementioned commercially available software is used to calculate the angle formed by the direction normal line to the (110) plane of each pixel in the taken image and the direction normal line to the surface of the base material, and select a pixel where this angle is within 0 to 10°. Subsequently, for the crystal orientation mapping, a color map is produced by distinguishing the selected pixel with a certain color. Based on the color of the color map as an indicator, the area ratio of the $\alpha$-$Al_2O_3$ crystal grains with (110) orientation in each of the lower layer portion and the upper layer portion of the $\alpha$-$Al_2O_3$ layer can be calculated.

According to the crystal orientation mapping, the area ratio of the $\alpha$-$Al_2O_3$ crystal grains with (110) orientation in each of the lower layer portion and the upper layer portion is identified as 40% or more. It should be noted that for calculation of the area ratio of $\alpha$-$Al_2O_3$ crystal grains with (110) orientation, it is preferable to appropriately select the observation magnification of the FE-SEM as described above, and it is preferable to adjust the field-of-view number so that an appropriate observation area is obtained.

It should be noted that a higher area ratio of the $\alpha$-$Al_2O_3$ crystal grains with (110) orientation is preferred in the lower layer portion and the upper layer portion, and the upper limit of the area ratio is ideally 100%. A higher area ratio of the $\alpha$-$Al_2O_3$ crystal grains with (110) orientation can produce the effect of suppressing coarsening of crystal grains in the lower layer portion and can produce the effect of suppressing generation of cracks in the upper layer portion.

<Polishing of Cross Section of $\alpha$-$Al_2O_3$ Layer>

In the following, a description will be given of a polishing method for preparing a cross-sectional surface (polished cross-sectional surface) of the $\alpha$-$Al_2O_3$ layer. This cross-sectional surface is necessary for calculating the area ratio of the $\alpha$-$Al_2O_3$ crystal grains with (001) orientation and the area ratio of the $\alpha$-$Al_2O_3$ crystal grains with (110) orientation, or necessary for measuring the thickness of the $\alpha$-$Al_2O_3$ layer and the thickness of the intermediate portion.

First, the $\alpha$-$Al_2O_3$ layer is formed based on a manufacturing method described later herein. The formed $\alpha$-$Al_2O_3$ layer is cut in such a manner that a cross section perpendicular to the $\alpha$-$Al_2O_3$ layer is obtained (namely the $\alpha$-$Al_2O_3$ layer is cut along a plane including the normal line to the surface of the base material and the resultant cross-sectional surface is exposed). After this, this cross-sectional surface is polished with waterproof abrasive paper (including SiC abrasive as an abrasive).

The $\alpha$-$Al_2O_3$ layer is cut as follows. The surface of the $\alpha$-$Al_2O_3$ layer (the surface of the coating in the case where another layer is formed on the $\alpha$-$Al_2O_3$ layer) is disposed in close contact with and fixed with wax or the like on a sufficiently large plate adapted for holding, for example. After this, a cutter with a rotary blade is used to cut the $\alpha$-$Al_2O_3$ layer in the direction perpendicular to the plate (cut the $\alpha$-$Al_2O_3$ layer with the rotary blade which is set perpendicular to the plate as precisely as possible). As long as the $\alpha$-$Al_2O_3$ layer is cut in this perpendicular direction, any part of the $\alpha$-$Al_2O_3$ layer may be cut.

The aforementioned polishing is performed with waterproof abrasive paper #400, #800, and #1500 in this order (the number (#) of the waterproof abrasive paper indicates difference in grit size of the abrasive, and the larger number represents a smaller grit size of the abrasive).

Subsequently, the polished cross-sectional surface is further smoothed by ion milling with Ar ions. The conditions of the ion milling are as follows.

Acceleration voltage: 6 kV

Ion beam incident angle: 0° from the direction normal line to the surface of the base material Ion beam irradiation time: six hours After this, the smoothed polished cross-sectional surface of the $\alpha$-$Al_2O_3$ layer may be observed with an FE-SEM having an EBSD apparatus. For example, Zeiss Supra 35 VP (manufactured by Carl Zeiss) with an HKL NL02 EBSD detector may be used. The EBSD data can be collected successively by individually directing a focused electron beam onto each pixel.

<Method of Manufacturing Surface-Coated Cutting Tool>

The surface-coated cutting tool of the present embodiment can be manufactured in the following way.

First, a raw material for the base material is sintered to prepare a base material made of a cemented carbide for example. Subsequently, common means such as brush or plastic medium is used as required to perform honing on a region in the vicinity of the cutting edge ridgeline of the base material.

Then, a coating can appropriately be formed on the base material by the chemical vapor deposition (CVD) method. In the case where the CVD method is used, the deposition temperature is 800 to 1200° C. This temperature is higher than the temperature for the physical vapor deposition method and thus improves the adhesion between the coating and the base material. In the case where any layers other than the $\alpha$-$Al_2O_3$ layer are formed as layers of the coating, these layers may be formed under conventionally known conditions.

For forming the $\alpha$-$Al_2O_3$ layer, $AlCl_3$, HCl, $CO_2$, $H_2S$, and $H_2$ may be used as a raw-material gas, for example. The contents are 0.5 to 5 vol % of $AlCl_3$, 1 to 5 vol % of HCl, 0.3 to 3 vol % of $CO_2$, 0.05 to 1.5 vol % of $H_2S$, and the remainder of $H_2$. Further, the conditions for the CVD apparatus include a temperature of 950 to 1050° C., a pressure of 1 to 20 kPa, and a gas flow rate (total gas amount) of 10 to 150 L/min.

It should be noted that the thickness of the $\alpha$-$Al_2O_3$ layer and the thickness of each layer other than the $\alpha$-$Al_2O_3$ layer can be adjusted by appropriately regulating the deposition time (the deposition rate for each layer is about 0.5 to 2.0 μm/hour).

After the coating is formed, surface treatment may be performed as required based on any of various methods such as brushing, or blasting such as sand blasting, wet blasting, shot peening, or the like, or bombardment for PVD. Accordingly, compressive stress can be applied to the coating.

EXAMPLES

In the following, the present invention will be described in further detail with reference to Examples. The present invention, however, is not limited to them.

<Preparation of Base Material>

Raw material powder with a composition: 6.5 mass % of Co, 1.2 mass % of TaC, 0.5 mass % of ZrC, and the remainder of WC was wet-mixed for ten hours with Attritor (wet-type media agitation, fine-grinding machine, trademark (model No.): "Wet-Type Attritor 100S" manufactured by Nippon Coke & Engineering Co., Ltd.) and thereafter dried.

After this, the green compact was press-formed with a pressure of 100 MPa and this green compact was placed in a vacuum container and held in vacuum of 2 Pa at 1440° C. for an hour.

Next, the green compact was taken out of the vacuum container, the bottom surface was surface-polished, and thereafter edge treatment was performed. Namely, an SiC brush was used to perform honing of 0.6 mm of the rake face, to thereby prepare the base material (manufactured by Sumitomo Electric Industries, Ltd.) of WC cemented carbide with a shape of CNMA120408 defined under JIS (Japanese Industrial Standard) B 4120 (2013). A plurality of base materials were prepared for different combinations of the conditions for forming the $\alpha$-$Al_2O_3$ layer as will be described later herein.

<Formation of Coating>

On the surface of each base material obtained in the above-described manner, a coating was formed. Specifically, the base material was set in a CVD apparatus and the coating was formed on the base material by the CVD method. The conditions for forming the coating are indicated in the following Table 1, Table 2, Table 3, and Table 4. Table 1 shows conditions (temperature condition, pressure condition, and thickness) for forming each layer other than the $\alpha$-$Al_2O_3$ layer. Table 2 shows the composition (in vol %) of the raw material gas for forming each layer other than the $\alpha$-$Al_2O_3$ layer. It should be noted that the conditions and the composition of the raw material gas for forming each layer other than the $\alpha$-$Al_2O_3$ layer are common to the base materials.

Table 3 shows the composition (in vol %) of the raw material gas for forming the $\alpha$-$Al_2O_3$ layer, and the temperature condition and the pressure condition for the raw material gas. As shown in Table 3, there are four gas conditions "a" to "d" for the raw material gas forming the $\alpha$-$Al_2O_3$ layer. In the present example, a combination of gas conditions out of these four gas conditions was applied to formation of the lower layer portion, the intermediate portion, and the upper layer portion, for example. In this way, 15 different kinds (Samples 1 to 15) of $\alpha$-$Al_2O_3$ layers were formed. Table 4 shows gas conditions (a to d) for the raw material gases applied to formation of the lower layer portion, the intermediate portion, and the upper layer portion of each sample, as well as the thickness of each layer portion. The thickness of the $\alpha$-$Al_2O_3$ layer and the thickness of each layer other than the $\alpha$-$Al_2O_3$ layer shown in Table 1 and Table 4 were measured in the above-described way. The thickness shown in the tables is an average of measured thicknesses at five locations.

Each layer portion was formed in the following way. In the case of Sample 5 for example, the lower layer portion was formed under the gas condition "d" for a certain time. After this, the gas condition (composition of the gas) was changed to "a" to form the intermediate portion. After this, the gas condition was changed to "d" to form the upper layer portion.

In Table 4, Sample 12 is an $\alpha$-$Al_2O_3$ layer formed of one layer, and this one layer has an area ratio of 80% of $\alpha$-$Al_2O_3$ crystal grains with (001) orientation, as will be described later herein. Therefore, the gas condition for forming this $\alpha$-$Al_2O_3$ layer and the thickness of this layer are indicated in the cells for the intermediate portion for Sample 12 in the table. Sample 13 is an $\alpha$-$Al_2O_3$ layer formed of two layers, and the two layers correspond to, in order from the base material, a layer having an area ratio of 15% of $\alpha$-$Al_2O_3$ crystal grains with (001) orientation and a layer having an area ratio of 75% of $\alpha$-$Al_2O_3$ crystal grains with (001) orientation. Therefore, respective gas conditions and respective layer thicknesses for these layers are indicated in the cells for the lower layer portion and the upper layer portion for Sample 13 in the table.

The thickness of the $\alpha$-$Al_2O_3$ layer and the thickness of each layer other than the $\alpha$-$Al_2O_3$ layer can be adjusted by appropriately regulating the deposition time for forming the layer. In Table 1 and Table 2, MT-TiCN represents a TiCN layer formed by the MT-CVD method, and HT-TiCN represents a TiCN layer formed by the HT-CVD (High Temperature CVD) method. TiN (1st layer) means that the TiN layer is formed first on the base material. In the present example, the makeup of the coating is a TiN layer, an MT-TiCN layer, an HT-TiCN layer, a TiCNO layer, and an $\alpha$-$Al_2O_3$ layer in order from the base material. The makeup of the $\alpha$-$Al_2O_3$ layer is a lower layer portion, an intermediate portion, and an upper layer portion in order from the base material. In the present example, the upper layer portion of the $\alpha$-$Al_2O_3$ layer is located at the outermost position of the coating.

TABLE 1

| | layers other than $\alpha$-$Al_2O_3$ layer | | | |
|---|---|---|---|---|
| | TiN (1st layer) | MT-TiCN | HT-TiCN | TiCNO |
| temperature (° C.) | 950 | 850 | 980 | 980 |
| pressure (kPa) | 15 | 10 | 50 | 30 |
| layer thickness (μm) | 1 | 5 | 2 | 1 |

TABLE 2

| | TiCl$_4$ | N$_2$ | CH$_4$ | C$_2$H$_4$ | CH$_3$CN | CO | H$_2$ |
|---|---|---|---|---|---|---|---|
| TiN (1st layer) | 3 | 25 | — | — | — | — | remainder |
| MT—TiCN | 3 | 20 | — | 3 | 3 | — | remainder |
| HT—TiCN | 2.5 | 20 | 5 | — | — | — | remainder |
| TiCNO | 3 | 15 | 5 | — | — | 1 | remainder |

TABLE 3

| gas condition | AlCl$_3$ | HCl | CO$_2$ | H$_2$S | H$_2$ | temperature (° C.) | pressure (kPa) |
|---|---|---|---|---|---|---|---|
| a | 0.6 | 2 | 0.5 | 1 | remainder | 980 | 10 |
| b | 0.6 | 2 | 0.5 | 0.6 | remainder | 980 | 10 |
| c | 0.6 | 2 | 0.5 | 0.3 | remainder | 980 | 10 |
| d | 0.6 | 4 | 0.5 | 0.1 | remainder | 980 | 10 |

TABLE 4

| | | $\alpha$-$Al_2O_3$ layer | | |
|---|---|---|---|---|
| | | lower layer portion | intermediate portion | upper layer portion |
| Sample 1 | gas condition | d | a | d |
| | thickness (μm) | 2 | 5 | 1 |
| Sample 2 | gas condition | c | a | c |
| | thickness (μm) | 2 | 5 | 1 |
| Sample 3 | gas condition | c | a | b |
| | thickness (μm) | 2 | 5 | 1 |
| Sample 4 | gas condition | b | a | c |
| | thickness (μm) | 2 | 5 | 1 |
| Sample 5 | gas condition | d | a | d |
| | thickness (μm) | 2 | 5 | 1 |
| Sample 6 | gas condition | c | a | d |

TABLE 4-continued

| | | α-Al$_2$O$_3$ layer | | |
|---|---|---|---|---|
| | | lower layer portion | intermediate portion | upper layer portion |
| Sample 7 | thickness (μm) | 2 | 5 | 1 |
| | gas condition | d | a | c |
| | thickness (μm) | 2 | 5 | 1 |
| Sample 8 | gas condition | d | a | d |
| | thickness (μm) | 3 | 4 | 1 |
| Sample 9 | gas condition | d | a | d |
| | thickness (μm) | 3 | 3 | 2 |
| Sample 10 | gas condition | d | a | d |
| | thickness (μm) | 4 | 11 | 3 |
| Sample 11 | gas condition | d | a | d |
| | thickness (μm) | 4 | 12 | 4 |
| Sample 12 | gas condition | — | a | — |
| | thickness (μm) | — | 8 | — |
| Sample 13 | gas condition | d | a | — |
| | thickness (μm) | 3 | 5 | — |
| Sample 14 | gas condition | d | b | d |
| | thickness (μm) | 2 | 5 | 1 |
| Sample 15 | gas condition | d | c | d |
| | thickness (μm) | 2 | 5 | 1 |

<Surface Treatment>

Each sample in which the coating was formed was subjected to blasting to apply compressive stress to the coating.

<Measurement of Orientation of α-Al$_2$O$_3$ Layer>

For each sample obtained in the above-described manner, the α-Al$_2$O$_3$ layer was cut along a plane including the normal line to the surface of the base material, and the resultant cross-sectional surface (cross-sectional surface perpendicular to the α-Al$_2$O$_3$ layer) was polished as described above. Further, the polished cross-sectional surface of the α-Al$_2$O$_3$ layer was observed with an FE-SEM having an EBSD apparatus (trademark (model No.): "SU6600" manufactured by Hitachi High-Technologies Corporation) to measure the crystal orientation of α-Al$_2$O$_3$ crystal grains as described above. Specifically, by the above-described crystal orientation mapping, the area ratio of α-Al$_2$O$_3$ crystal grains with (001) orientation and the area ratio of α-Al$_2$O$_3$ crystal grains with (110) orientation in each of the lower layer portion, the intermediate portion, and the upper layer portion of the α-Al$_2$O$_3$ layer were calculated. Whether crystal grains were α-Al$_2$O$_3$ crystal grains with (001) orientation or α-Al$_2$O$_3$ crystal grains with (110) orientation was determined in accordance with the definitions as described above. For calculation of the area ratio of α-Al$_2$O$_3$ crystal grains with (001) orientation and the area ratio of α-Al$_2$O$_3$ crystal grains with (110) orientation, the observation magnification 20000× was used, and the field-of-view number was adjusted so that an observation area of 200 μm$^2$ was obtained.

The area ratio of α-Al$_2$O$_3$ crystal grains with (001) orientation and the area ratio of α-Al$_2$O$_3$ crystal grains with (110) orientation obtained from the above-described measurement of orientation are shown in Table 5 below. In Table 5, the thickness of the α-Al$_2$O$_3$ layer (μm) and the ratio of the thickness of the intermediate portion to the thickness of the α-Al$_2$O$_3$ layer (thickness of intermediate portion/thickness of α-Al$_2$O$_3$ layer) (%) are also shown.

<Cutting Test>

For each sample, namely cutting tool, a cutting test was conducted under the following conditions.

Workpiece: round bar of FCD450
Cutting Speed: 250 m/min
Feed: 0.30 mm/rev
Depth of Cut: 1.5 mm
Cutting Oil: wet (water-soluble oil)
Evaluation: flank wear width ≥0.3 mm means the end of life is reached.

For the cutting test, the cutting tool was set on a cutter and the workpiece was cut. For every 30 seconds, the cutting tool was removed from the cutter and the flank wear amount was measured. The time taken for the flank wear amount to reach more than 0.3 mm was considered as the life and evaluation was made based on this. As this time of a cutting tool is longer, the life thereof is accordingly longer. Thus, this cutting tool can be evaluated as having the effects that the coating strength is improved and coarsening of crystal grains and generation of cracks for example can be prevented. These results are also shown in Table 5.

The "remarks" column in Table 5 indicates change of the shape of the tool recognized through observation of each sample during and after the cutting test. In the "remarks" column of Table 5, "good performance" means that the life was eight minutes or more and any change of the shape suggesting occurrence of chipping or significant increase of wear for example was not observed before the end of life.

Moreover, "chipping occurred" means that chipping occurred during the cutting test and the end of life was reached. "Large wear" means that wear increased significantly during the cutting test and the end of life was reached. "Coating peeled off" means that the coating peeled off during the cutting test and the end of life was reached.

TABLE 5

| | α-Al$_2$O$_3$ layer | | | | | | | | | |
|---|---|---|---|---|---|---|---|---|---|---|
| | ratio of grains with (001) orientation (area %) | | | ratio of grains with (110) orientation (area %) | | | ratio: intermediate portion/ α-Al$_2$O$_3$ layer (%) | thickness of α-Al$_2$O$_3$ layer (μm) | cutting test life (min) | remarks |
| | lower layer portion | inter-mediate portion | upper layer portion | lower layer portion | inter-mediate portion | upper layer portion | | | | |
| Sample 1 | 10 | 80 | 10 | 30 | 5 | 30 | 62.5 | 8 | 10 | good performance |
| Sample 2 | 30 | 85 | 30 | 10 | <5 | 10 | 62.5 | 8 | 9 | good performance |
| Sample 3 | 30 | 80 | 40 | 15 | 5 | 10 | 62.5 | 8 | 6 | chipping occurred |
| Sample 4 | 40 | 75 | 30 | 10 | 5 | 10 | 62.5 | 8 | 6 | large wear |
| Sample 5 | 5 | 80 | 5 | 50 | 5 | 45 | 62.5 | 8 | 13 | good performance |
| Sample 6 | 10 | 70 | 5 | 30 | 5 | 50 | 62.5 | 8 | 11 | good performance |
| Sample 7 | 5 | 90 | 10 | 50 | <5 | 25 | 62.5 | 8 | 11 | good performance |
| Sample 8 | 15 | 65 | 10 | 25 | 10 | 35 | 50 | 8 | 9.5 | good performance |
| Sample 9 | 10 | 70 | 5 | 35 | 10 | 35 | 37.5 | 8 | 5 | large wear |
| Sample 10 | 10 | 60 | 15 | 35 | 10 | 35 | 61.1 | 18 | 9 | good performance |

TABLE 5-continued

| | α-Al₂O₃ layer | | | | | | | | |
|---|---|---|---|---|---|---|---|---|---|
| | ratio of grains with (001) orientation (area %) | | | ratio of grains with (110) orientation (area %) | | | ratio: intermediate portion/ α-Al₂O₃ layer (%) | thickness of α-Al₂O₃ layer (μm) | cutting test life (min) | remarks |
| | lower layer portion | intermediate portion | upper layer portion | lower layer portion | intermediate portion | upper layer portion | | | | |
| Sample 11 | 10 | 65 | 10 | 35 | 5 | 30 | 60 | 20 | 3 | coating peeled off |
| Sample 12 | — | 80 | — | — | 5 | — | 100 | 8 | 5 | chipping occurred, large wear |
| Sample 13 | 15 | 75 | — | 25 | <5 | — | 62.5 | 8 | 6 | chipping occurred |
| Sample 14 | 10 | 40 | 10 | 25 | 5 | 30 | 62.5 | 8 | 8 | good performance |
| Sample 15 | 10 | 30 | 10 | 30 | 5 | 30 | 62.5 | 8 | 6 | large wear of rake face |

<Test Results and Analysis>

As shown in Table 5, the α-Al₂O₃ layers of the present example (Samples 1, 2, 5, 6, 7, 8, 10, and 14) are each made up of the lower layer portion and the upper layer portion both having an area ratio of less than 35% of α-Al₂O₃ crystal grains with (001) orientation and the intermediate portion having an area ratio of 35% or more of α-Al₂O₃ crystal grains with (001) orientation. Moreover, the thickness of the α-Al₂O₃ layers is 4 to 18 μm, and the ratio of the thickness of the intermediate portion to the thickness of the α-Al₂O₃ layer is 50% or more. The lower layer portion and the upper layer portion each have a thickness of 1 μm or more. These samples can be evaluated as exhibiting "good performance."

In particular, Samples 5, 6, and 7 have, in addition to the above-described features of the α-Al₂O₃ crystal grains with (001) orientation in the lower layer portion, the intermediate portion, and the upper layer portion, the feature that the area ratio of α-Al₂O₃ crystal grains with (110) orientation is 40% or more in at least the upper layer portion or the lower layer portion. These samples have a life of 11 minutes or more and exhibit still better performance.

Then, α-Al₂O₃ layers of a comparative example (Samples 3, 4, 9, 11, 12, 13, and 15) are analyzed. Regarding Sample 3, the upper layer portion has an area ratio of 40% of α-Al₂O₃ crystal grains with (001) orientation, the evaluation is "chipping occurred" and the life is six minutes. The reason for this is considered as the fact that cracks occurred in the coating during cooling of the tool. Regarding Sample 4, the upper layer portion has an area ratio of 40% of α-Al₂O₃ crystal grains with (001) orientation, the evaluation is "large wear" and the life is six minutes. The reason for this is considered as the fact that α-Al₂O₃ crystal grains coarsened in the process of forming the coating.

Regarding Sample 9, the ratio of the thickness of the intermediate portion to the thickness of the α-Al₂O₃ layer is less than 50%, the evaluation is "large wear", and the life is five minutes. The reason for this is considered as the fact that the area ratio of α-Al₂O₃ crystal grains with (001) orientation in the α-Al₂O₃ layer is low and the effect of improving the coating strength cannot sufficiently be obtained. Regarding Sample 11, the thickness of the α-Al₂O₃ layer is 20 μm, the evaluation is "coating peeled off" and the life is three minutes. The reason for this is considered as the excessively large thickness of the α-Al₂O₃ layer.

Regarding Samples 12 and 13, the α-Al₂O₃ layer is made up of one layer or two layers, the evaluation is "chipping occurred" and the evaluation "large wear" is made in some cases. The life is five or six minutes. The reason for this is considered as the fact that the absence of any of the lower layer portion, the intermediate portion, and the upper layer portion in the α-Al₂O₃ layer causes the disadvantages. Regarding Sample 15, the intermediate portion has an area ratio of 30% of α-Al₂O₃ crystal grains with (001) orientation, the evaluation is "large wear" of the rake face, and the life is six minutes. The reason for this is considered as the fact that the area ratio of α-Al₂O₃ crystal grains with (001) orientation in the α-Al₂O₃ layer is low and the effect of improving the coating strength cannot sufficiently be obtained.

Accordingly, the surface-coated cutting tools of the present example are superior to the surface-coated cutting tools of the comparative example, in that the effect of improving the coating strength is sufficiently obtained by means of the orientation in the (001) plane direction, and further, coarsening of crystal grains and generation of cracks in the coating during cooling, which are disadvantages due to the excessively strong orientation in the (001) plane direction, can be suppressed.

While the embodiment and examples of the present invention have been described above, it is originally intended that the above-described features of the embodiment and examples may be combined as appropriate or modified in various manners.

It should be construed that the embodiment disclosed herein is given by way of example in all respects, not by way of limitation. It is intended that the scope of the present invention is defined by claims, not by the above-described embodiment, and encompasses all modifications equivalent in meaning and scope to the claims.

The invention claimed is:

1. A surface-coated cutting tool comprising a base material and a coating formed on the base material,
    the coating including an α-Al₂O₃ layer containing a plurality of α-Al₂O₃ crystal grains,
    the α-Al₂O₃ layer including a lower layer portion disposed at a side of the base material, an intermediate portion disposed on the lower layer portion, and an upper layer portion disposed on the intermediate portion,
    an area ratio of α-Al₂O₃ crystal grains with (001) orientation in the lower layer portion being less than 35% in a crystal orientation mapping, the crystal orientation mapping being performed on a polished cross-sectional surface of the α-Al₂O₃ layer using an electron backscatter diffraction analysis apparatus,
    an area ratio of α-Al₂O₃ crystal grains with (001) orientation in the intermediate portion being 35% or more in the crystal orientation mapping, an area ratio of α-Al$_2$O$_3$ crystal grains with (001) orientation in the upper layer portion being less than 35% in the crystal orientation mapping, the α-Al$_2$O$_3$ layer having a thickness of 4 to 18 μm, a thickness of the intermediate portion occupying 50% or more of the thickness of the α-Al$_2$O$_3$ layer, and the lower layer portion and the upper layer portion each having a thickness of 1 μm or more.

2. The surface-coated cutting tool according to claim 1, wherein an area ratio of α-Al$_2$O$_3$ crystal grains with (110) orientation in the lower layer portion is 40% or more in the crystal orientation mapping.

3. The surface-coated cutting tool according to claim 1, wherein an area ratio of α-Al$_2$O$_3$ crystal grains with (110) orientation in the upper layer portion is 40% or more in the crystal orientation mapping.

* * * * *